US 9,861,018 B2

(12) United States Patent
Seki et al.

(10) Patent No.: US 9,861,018 B2
(45) Date of Patent: Jan. 2, 2018

(54) WIRING PROTECTIVE COVER STRUCTURE FOR ELECTRIC DRIVE VEHICLE

(71) Applicant: HONDA MOTOR CO., LTD., Tokyo (JP)

(72) Inventors: Hidemi Seki, Wako (JP); Keisuke Itou, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 315 days.

(21) Appl. No.: 14/350,852

(22) PCT Filed: Oct. 17, 2012

(86) PCT No.: PCT/JP2012/076849
§ 371 (c)(1),
(2) Date: Apr. 10, 2014

(87) PCT Pub. No.: WO2013/061846
PCT Pub. Date: May 2, 2013

(65) Prior Publication Data
US 2015/0195960 A1    Jul. 9, 2015

(30) Foreign Application Priority Data

Oct. 24, 2011    (JP) ................................ 2011-233012

(51) Int. Cl.
*H05K 9/00*       (2006.01)
*B60K 1/04*       (2006.01)
(Continued)

(52) U.S. Cl.
CPC ............ *H05K 9/0052* (2013.01); *B60K 1/04* (2013.01); *B60L 1/003* (2013.01); *B60L 7/14* (2013.01);
(Continued)

(58) Field of Classification Search
CPC ............ H05K 9/0052; H05K 7/20127; H05K 7/20845; H01M 10/625; H01F 27/085; B60R 16/033; B62D 21/17
See application file for complete search history.

(56) References Cited

U.S. PATENT DOCUMENTS 5,390,754 A  *  2/1995   Masuyama ............... B60K 1/04
                                                       105/51
5,392,873 A  *  2/1995   Masuyama ............. B60R 16/04
                                                       180/68.5
(Continued)

FOREIGN PATENT DOCUMENTS

CN            1388787 A          1/2003
DE     11 2007 002 734 T5      10/2009
(Continued)

OTHER PUBLICATIONS

Extended European Search Report dated May 18, 2015, issued in corresponding European Patent Application No. 12843542.7 (6 pages).
(Continued)

*Primary Examiner* — David M Sinclair
*Assistant Examiner* — Robert Brown
(74) *Attorney, Agent, or Firm* — Westerman, Hattori, Daniels & Adrian, LLP

(57) ABSTRACT

A wiring protective cover structure for an electric drive vehicle is provided that can be used to cool a battery while effectively blocking noise that is generated from wiring for connecting an electric power converter and the battery disposed on a floor panel. A DC line cable 23 and a control line cable 25 that connect a battery 21 and an electric power converter 22 are disposed on a top surface of a center tunnel 37 of a vehicle 1, and a metallic wiring protective cover 35 has a cooling passage 30 disposed therein and is disposed on
(Continued)

a floor panel 36 so as to cover the DC line cable 23 and the control line cable 25.

7 Claims, 7 Drawing Sheets

(51) Int. Cl.

| | | |
|---|---|---|
| *B60R 16/02* | (2006.01) | |
| *B60L 1/00* | (2006.01) | |
| *B60L 7/14* | (2006.01) | |
| *B60L 11/14* | (2006.01) | |
| *B60L 11/18* | (2006.01) | |
| *B62D 21/17* | (2006.01) | |
| *H01M 10/625* | (2014.01) | |
| *H01M 10/6561* | (2014.01) | |
| *B60R 16/033* | (2006.01) | |
| *H05K 7/20* | (2006.01) | |
| *B60K 1/00* | (2006.01) | |
| *B60K 11/06* | (2006.01) | |

(52) U.S. Cl.
CPC ........... *B60L 11/14* (2013.01); *B60L 11/1874* (2013.01); *B60L 11/1877* (2013.01); *B60L 11/1879* (2013.01); *B60R 16/0215* (2013.01); *B60R 16/033* (2013.01); *B62D 21/17* (2013.01); *H01M 10/625* (2015.04); *H01M 10/6561* (2015.04); *H05K 7/20845* (2013.01); *B60K 11/06* (2013.01); *B60K 2001/005* (2013.01); *B60K 2001/0416* (2013.01); *B60L 2210/10* (2013.01); *B60L 2210/40* (2013.01); *B60L 2240/34* (2013.01); *B60Y 2400/61* (2013.01); *H01M 2220/20* (2013.01); *Y02T 10/70* (2013.01); *Y02T 10/7005* (2013.01); *Y02T 10/705* (2013.01); *Y02T 10/7077* (2013.01); *Y02T 10/7216* (2013.01); *Y02T 10/7241* (2013.01)

(56) References Cited

U.S. PATENT DOCUMENTS

| | | | |
|---|---|---|---|
| 6,662,891 B2* | 12/2003 | Misu | B60K 1/04 180/65.1 |
| 6,772,027 B2 | 8/2004 | Kurihara | |
| 6,902,020 B2* | 6/2005 | Kronner | B60R 16/04 180/68.5 |
| 7,419,209 B1 | 9/2008 | Mangiapane et al. | |
| 8,440,338 B2* | 5/2013 | Sato | H01M 2/1072 320/103 |
| 9,126,477 B2* | 9/2015 | Zhu | |
| 2002/0152615 A1 | 10/2002 | Kurihara | |
| 2005/0011692 A1* | 1/2005 | Takahashi | B60R 16/04 180/68.5 |
| 2008/0296075 A1* | 12/2008 | Zhu | B60K 1/04 180/68.1 |
| 2009/0183935 A1 | 7/2009 | Tsuchiya | |
| 2009/0260905 A1* | 10/2009 | Shinmura | B60K 1/04 180/68.1 |
| 2010/0089675 A1 | 4/2010 | Nagata et al. | |
| 2013/0049688 A1* | 2/2013 | Minami | B60H 1/00278 320/109 |
| 2014/0071635 A1* | 3/2014 | Werner | H05K 3/30 361/748 |
| 2015/0027772 A1* | 1/2015 | Hashimoto | B60R 16/0215 174/382 |

FOREIGN PATENT DOCUMENTS

| | | |
|---|---|---|
| EP | 1 932 707 A1 | 6/2008 |
| JP | 2000-217231 A | 8/2000 |
| JP | 2003-169403 A | 6/2003 |
| JP | 2005-125956 A | 5/2005 |
| JP | 2007-294290 A | 11/2007 |
| JP | 2007-296935 A | 11/2007 |
| JP | 2009-119890 A | 6/2009 |
| WO | 2007/125694 A1 | 11/2007 |

OTHER PUBLICATIONS

International Search Report dated Jan. 22, 2013, issued in corresponding application No. PCT/JP2012/076849.
Office Action dated Jun. 30, 2015, issued in counterpart Chinese Patent Application No. 201280043089.9 (5 pages).

* cited by examiner

WIRING PROTECTIVE COVER STRUCTURE FOR ELECTRIC DRIVE VEHICLE

TECHNICAL FIELD

The present invention relates to a wiring protective cover structure for an electric drive vehicle that is applied to an electric drive vehicle such as an electric vehicle and a hybrid electric vehicle and that is effective in taking measures against electromagnetic noise from wiring.

BACKGROUND ART

For example, in a hybrid electric vehicle, a battery as a drive energy source of an electric motor is mounted at a rear of a seatback of a rear seat, in a luggage space, or under a floor of the luggage space. Because the battery is a heat generating component that generates heat every timing of being charged or discharged, the battery has to be cooled to maintain performance thereof, and thus it has been considered to take in cooling air from a vehicle cabin or the like for cooling (see Patent Literature 1). A battery pack 100 in Patent Literature 1 is described as shown in FIG. 8, in which air in a vehicle cabin 104 is taken in from an air supply pipe 103 being disposed between a floor member 101 and a rear seat 102, thus the air is supplied as cooling wind for cooling the battery pack 100. A rib 105 as a thermal insulator is disposed between the air supply pipe 103 and the floor member 101.

In addition, as shown in FIG. 9, a hybrid electric vehicle 120 is disclosed such that an engine 121, a generator 122, and a traveling motor 123 are disposed in a front part with a battery 124 being disposed in a rear part. The vehicle 120 further includes an inverter unit 125 disposed at a bottom near a center part thereof (see Patent Literature 2). Accordingly, compared to a vehicle in which the inverter unit 125 is disposed in a limited space in a front part thereof, freedom in design can be secured as the inverter 125 is easily mountable.

CITATION LIST

Patent Literature

Patent Literature 1: JP-2007-294290-A
Patent Literature 2: JP-2003-169403-A

SUMMARY OF INVENTION

Technical Problem

However, as for the battery pack 100 of Patent Literature 1, since the dedicated air supply pipe 103 that is thermally insulated from the floor member 101 is disposed between the floor member 101 and the rear seat 102, a dedicated space for disposing the air supply pipe 103 is needed, which turns out increasing the manufacturing and assembling costs for the air supply pipe 103. Meanwhile, in the vehicle of Patent Literature 2, a battery 124 and the inverter unit 125 that are separately disposed are connected by a power supply line cable 126, which requires a noise block mechanism to suppress the influence of electromagnetic noise that is generated from such a power supply line cable 126. However, there is no description of such a mechanism.

The invention has been made in view of the above-described problem and has an object to provide a wiring protective cover structure for an electric drive vehicle that can be used to cool a battery while effectively blocking noise that is generated from wiring for connecting an electric power converter and the battery disposed on a floor panel.

Solution to Problem

With a view to achieving the object, the first aspect of embodiments defines a wiring protective cover structure for an electric drive vehicle (e.g., an electric drive vehicle 1 in embodiment) including:

a battery (e.g., a battery 21 in embodiment);

an electric power converter that converts electric power from the battery (e.g., an electric power converter 22 in embodiment);

a cooling passage through which air used for cooling the battery flows (e.g., a cooling passage 30 in embodiment);

wiring that connects the battery and the electric power converter (e.g., a DC line cable 23 and a control line cable 25 in embodiment); and a wiring protective cover that protects the wiring (e.g., a wiring protective cover 35 in embodiment), wherein the wiring is disposed on a top surface of a floor panel (e.g., a floor panel 36 in embodiment) of the vehicle, and wherein the wiring protective cover is formed as a metallic cover that has the cooling passage disposed therein and that is disposed on the floor panel to cover the wiring.

The second aspect of embodiments further defines the structure, wherein the battery and the electric power converter are disposed via a seat (e.g., a rear seat 4 in embodiment) in a vehicle longitudinal direction, and wherein the cooling passage is disposed under the seat.

The third aspect of embodiments further defines the structure, wherein the wiring includes a DC line cable (e.g., the DC line cable 23 in embodiment) that supplies electric power to the electric power converter and a control line cable (e.g., the control line cable 25 in embodiment) that controls the battery, and wherein the DC line cable and the control line cable are separately disposed at both sides of the wiring protective cover in a vehicle width direction.

The fourth aspect of embodiments further defines the structure, wherein the electric power converter and the wiring protective cover are disposed on a center tunnel (e.g., a center tunnel 37 in embodiment) that is formed by the floor panel.

The fifth aspect of embodiments further defines the structure, wherein the electric power converter is disposed under a front seat (e.g., a front seat 5 in embodiment), and the wiring protective cover is disposed under a rear seat (e.g., a rear seat 4 in embodiment) at a rear of the front seat.

The sixth aspect of embodiments further defines the structure, wherein the cooling passage is directly formed by the floor panel that has the center tunnel and the metallic wiring protective cover that is disposed to cover the wiring.

The seventh aspect of embodiments further defines the structure, wherein the cooling passage has a duct member (e.g., duct members 50, 50a in embodiment) disposed in a space formed by the floor panel that has the center tunnel and the metallic wiring protective cover that is disposed to cover the wiring.

The eighth aspect of embodiments further defines the structure, wherein the duct member has plural wiring holding sections (e.g., wiring holding sections 51 in embodiment), each of which extends laterally from a side surface thereof in the vehicle width direction so as to hold the wiring.

Advantageous Effects of Invention

According to the first aspect, electromagnetic noise that is generated by the wiring is blocked by the metallic wiring protective cover and the floor panel, and the inside of the wiring protective cover can be used as the cooling passage; therefore, there is no need for adding a new dedicated member with strength for protecting a duct.

According to the second aspect, it is possible to increase freedom in design of installation positions of the battery and the electric power converter and is also possible to dispose the cooling passage without reducing a space in a vehicle cabin.

According to the third aspect, it is possible to reduce the influence of the electromagnetic noise generated from the DC line cable on the control line cable.

According to the fourth and fifth aspects, the wiring for connecting the battery and the electric power converter can be formed as short as possible, and the influence of the noise can be reduced.

According to the sixth aspect, it is possible to form the cooling passage without providing the new dedicated member for protecting the duct.

According to the seventh aspect, it is possible to form the cooling passage by the simple duct member while the wiring protective cover receives an external force.

According to the eighth aspect, it is possible to reduce assembling man-hours and cost for holding the wiring.

MODE FOR CARRYING OUT THE INVENTION

Figure 1:
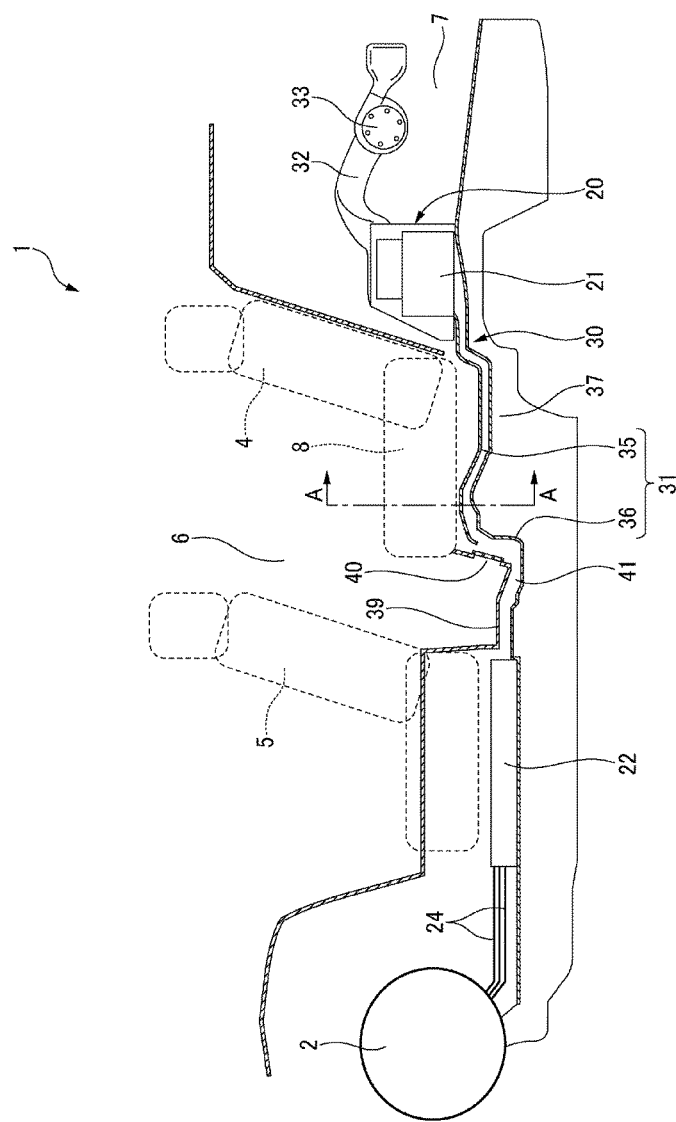
FIG. 1 is a vertical cross-sectional view for showing a center part of an electric drive vehicle in a vehicle width direction, to which a wiring protective cover structure for the electric drive vehicle of the invention is applied.

A description will hereinafter be made on a wiring protective cover structure for an electric drive vehicle according to one embodiment of the invention with reference to the accompanied drawings. It is assumed that each of the drawings is seen in a direction that reference numerals are indicated.

Figure 2:
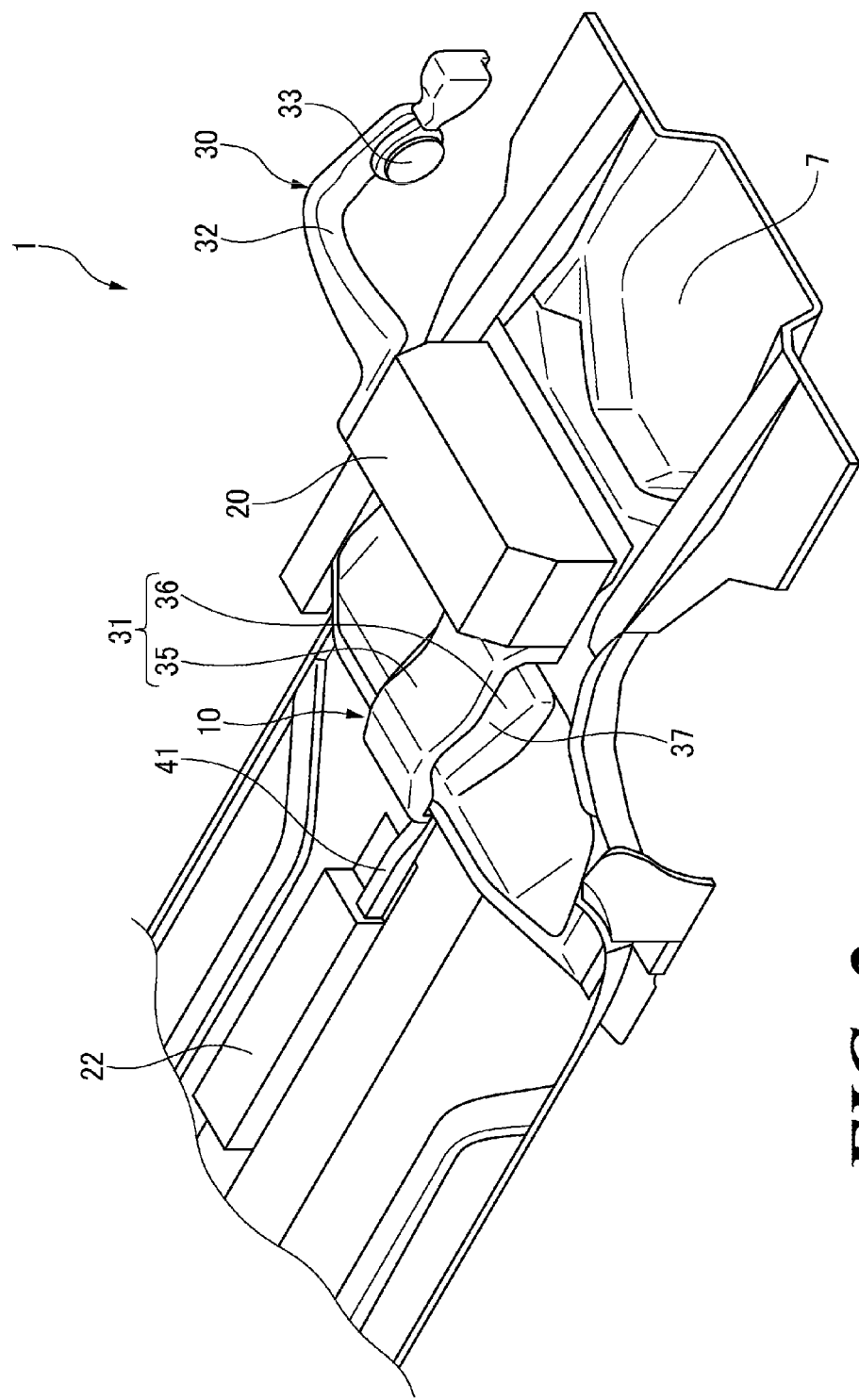
FIG. 2 is a perspective view of the wiring protective cover structure for the electric drive vehicle that is shown in FIG. 1.

As shown in FIG. 1 and FIG. 2, an electric drive vehicle 1 is a hybrid electric vehicle having the wiring protective cover structure with the following running modes. That is, the hybrid electric vehicle is capable of traveling in an engine travel mode in which an unillustrated engine and a traveling motor 2 are directly connected and the vehicle is driven by the engine, a motor travel mode in which the vehicle is driven by the traveling motor 2, and an assisted travel mode in which the traveling motor 2 assists generation of a driving force when the vehicle travels by the engine. The traveling motor 2 is a three-phase AC motor, for example, and is disposed in a front part of the vehicle 1.

An electric power converter (PDU) 22 is connected to the traveling motor 2 by a three-phase line 24. The electric power converter 22 is disposed in an intermediate part in a vehicle width direction between front seats 5, namely between a driver seat and a passenger seat, having configuration to include an inverter, a DC-DC converter, and the like. The electric power converter 22 is connected to a battery box 20 that has a battery 21 mounted therein at a rear of a rear seat 4 by a DC line cable 23 and a control line cable 25 that controls the battery 21.

Then, the electric power converter 22 obtains DC power from the battery 21 and converts the DC power to three-phase AC power for driving the traveling motor 2 while converting regenerative power of the traveling motor 2 to the DC power to charge the battery 21. Because a DC voltage that is converted by the inverter is a high voltage, it is partially lowered by the DC-DC converter.

Figure 4:
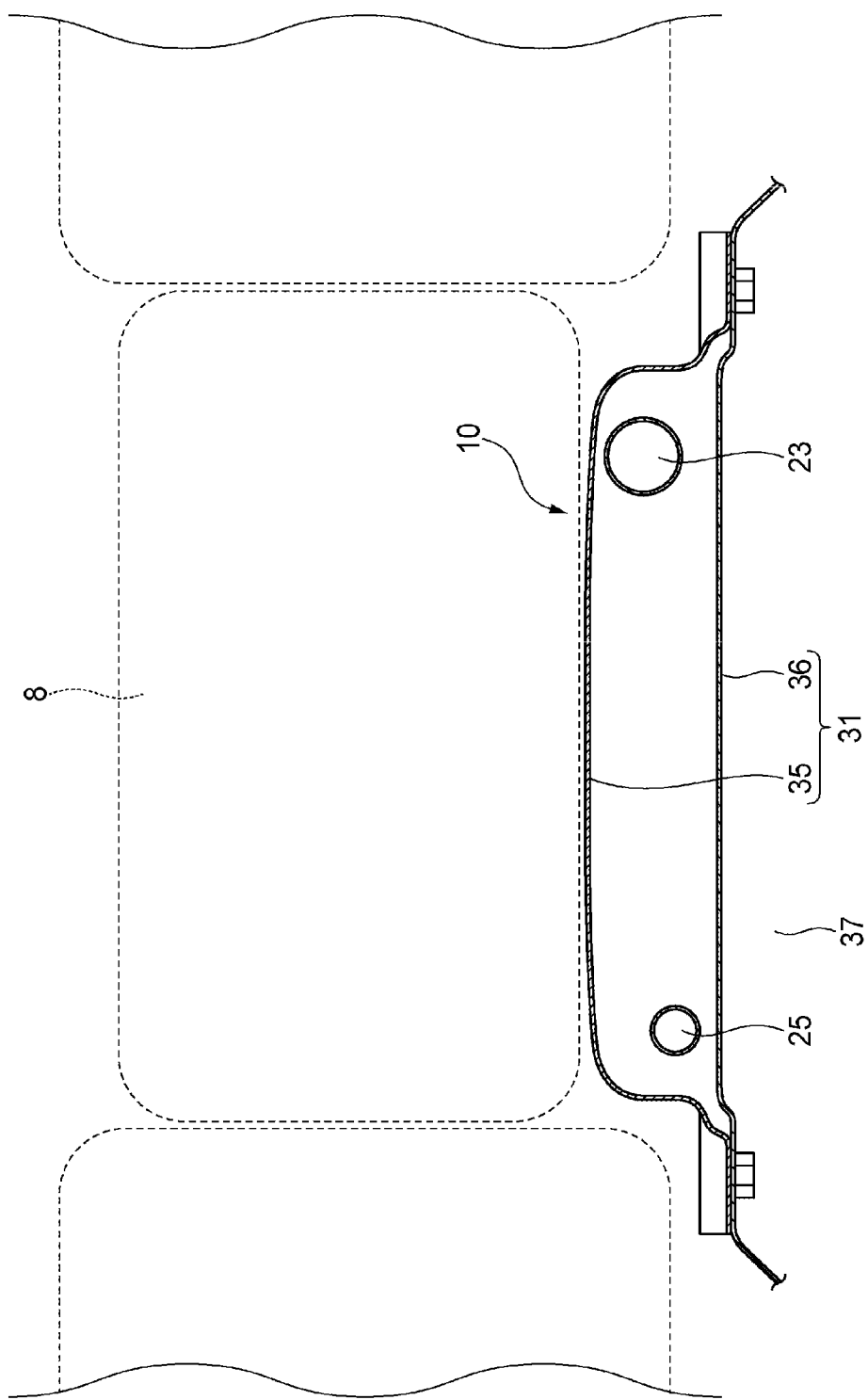
FIG. 4 is a cross-sectional view taken along a line A-A of FIG. 1.

The DC line cable 23 and the control line cable 25 that are connected between the battery 21 and the electric power converter 22 extend in a longitudinal direction on a top surface of a center tunnel 37 of a floor panel 36, and are covered by a metallic wiring protective cover 35 fixed to the floor panel 36 that has the center tunnel 37. The metallic wiring protective cover 35 that is formed to have an inverted U-shaped cross section is disposed under a center seat cushion 8 and is fixed to the floor panel 36, thereby forming a space with a flat cross section that is long in the vehicle width direction. As shown in FIG. 4, the DC line cable 23 and the control line cable 25 are separately arranged at both sides of the wiring protective cover 35 in the vehicle width direction.

The DC line cable 23 that extends forward of the vehicle from the wiring protective cover 35 is partially covered by a metallic DC line cover 41. The control line cable 25 that extends forward of the vehicle from the wiring protective cover 35 is partially bent in a direction to separate from the DC line cable 23, arranged to bypass an opening 40, and connected to the electric power converter 22.

As described above, the DC line cable 23 is covered by the metallic wiring protective cover 35 and the metallic DC line cover 41; therefore, even when a large current flows through the DC line cable 23 and electromagnetic noise is thereby generated from the DC line cable 23, the electromagnetic noise is blocked by these covers 35, 41 and thus has no influence on various equipment in a vehicle cabin 6. Because the control line cable 25 is separately disposed from the DC line cable 23, the influence of the electromagnetic noise from the DC line cable 23 on the control line cable 25 can also be reduced.

Because the DC line cable 23 and the control line cable 25 are covered by the metallic wiring protective cover 35 with high strength, the wiring protective cover 35 acts as a strengthening member and protects the DC line cable 23 and the control line cable 25.

The battery box 20 is connected to a cooling passage 30 that takes in air in the vehicle cabin 6 to cool the battery 21. The cooling passage 30 includes an intake duct 31 that is connected to the battery box 20 on an upstream side thereof, an exhaust duct 32 that is connected to the battery box 20 on a downstream side thereof, and a cooling fan 33 that is disposed in a middle of the exhaust duct 32.

Figure 3:
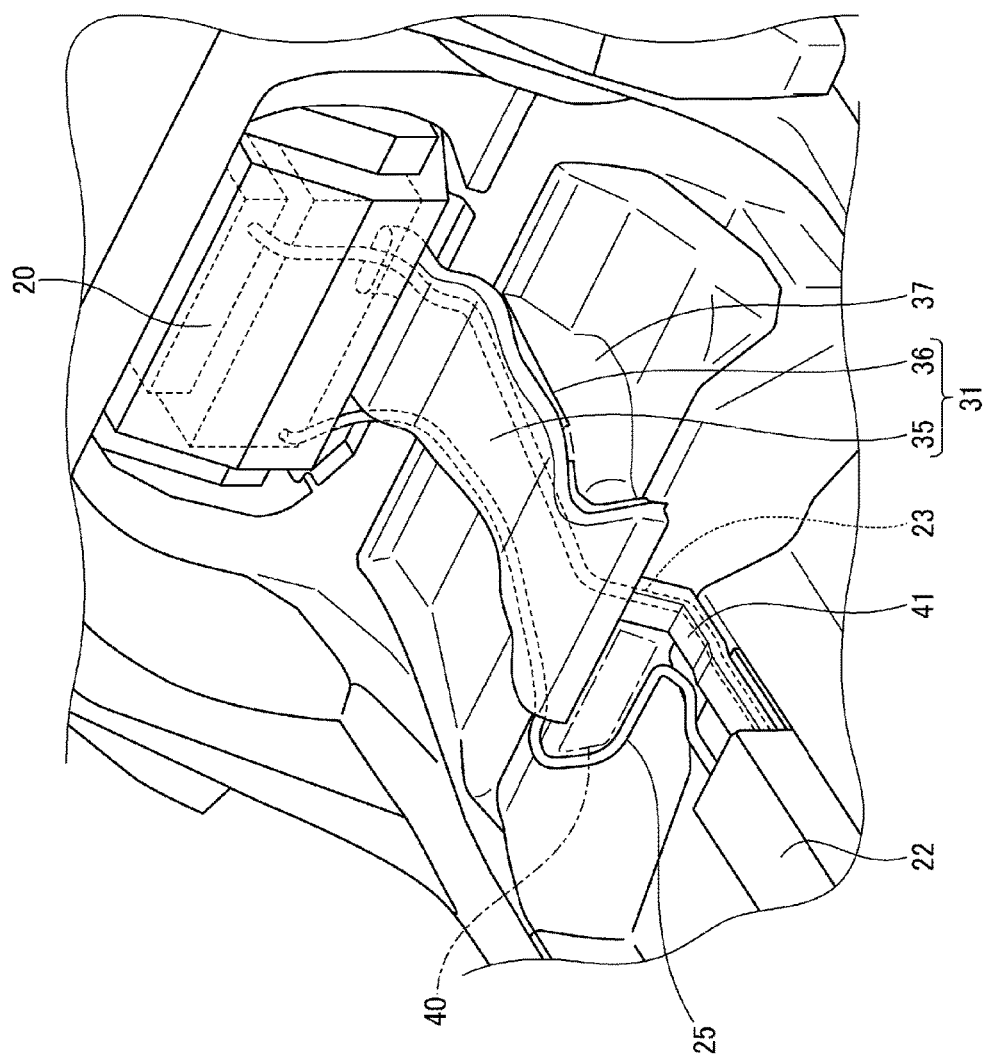
FIG. 3 is a perspective view of main components in a rear part of the vehicle in a state that a rear seat and a floor carpet are removed for the illustration of the wiring protective cover structure.

Also referring to FIG. 3 and FIG. 4, the intake duct 31 is directly formed by the space with the flat cross section that is defined by the metallic wiring protective cover 35 and the floor panel 36 for accommodating the DC line cable 23 and the control line cable 25.

The wiring protective cover 35 covers the floor panel 36 from a bottom of the battery box 20 to a front surface under the center seat cushion 8 of the rear seat 4. Meanwhile, the intake duct 31 is opened to face the opening 40 that is provided in a floor carpet 39 in the front surface under the center seat cushion 8 of the rear seat 4. In this embodiment, an intake grill, which is provided with a number of holes, is mounted to the opening 40. In addition, an exit side of the intake duct 31 is connected to an opening of the battery box 20 through which the DC line cable 23 is inserted into the battery box 20.

The exhaust duct 32 is, for example, a hollow member which is bent and formed of a synthetic resin with a substantially rectangular cross section. The exhaust duct 32 extends outward in the vehicle width direction from a side surface of the battery box 20, then bending rearward, and extends between a vehicle body and a sidewall that forms a luggage space 7.

Accordingly, when the cooling fan 33 is rotated, cold air in the vehicle cabin 6 is taken in from the opening 40 that is provided in the front surface under the center seat cushion 8. Thereafter the cold air is sent to the battery box 20 through the intake duct 31 to cool the battery 21 to be discharged from the exhaust duct 32 to a space between the vehicle body and the sidewall. Because the intake duct 31 takes in the air in the vehicle cabin 6 from the opening 40 that is disposed in the front surface under the rear seat 4, it is possible to take in the air in the vehicle cabin 6 at a relatively low temperature and is thus possible to effectively cool the battery 21.

As described above, according to the wiring protective cover structure for the electric drive vehicle according to this embodiment, the DC line cable 23 and the control line cable 25 that connect the battery 21 and the electric power converter 22 are disposed on the top surface of the floor panel 36, and the wiring protective cover 35 is formed as the metallic cover 35 that has the cooling passage 30 disposed therein and that is disposed on the floor panel 36 to cover the DC line cable 23 and the control line cable 25. Accordingly, the electromagnetic noise that is generated from the DC line cable 23 is blocked by the metallic wiring protective cover 35 and the floor panel 36, and the inside of the wiring protective cover 35 can be used as the cooling passage; therefore, there is no need for adding the new dedicated member with strength for protecting the duct.

The battery 21 and the electric power converter 22 are disposed via the rear seat 4 in the vehicle longitudinal direction, and the cooling passage 30 is disposed under the center seat cushion 8; therefore, it is possible to increase freedom in design of installation positions of the battery 21 and the electric power converter 22 and is also possible to dispose the cooling passage 30 without reducing a space in the vehicle cabin 6.

Since the DC line cable 23, which supplies the electric power to the electric power converter 22, and the control line cable 25, which controls the battery 21, are separately disposed at the both sides of the wiring protective cover 35 in the vehicle width direction, it is possible to reduce the influence of the electromagnetic noise that is generated from the DC line cable 23 on the control line cable 25.

Due to the configurations such that the electric power converter 22 and the wiring protective cover 35 are disposed on the center tunnel 37, which is formed by the floor panel 36, the DC line cable 23 can be formed as short as possible, and the influence of the noise can be reduced.

Since the cooling passage 30 is directly formed by the floor panel 36, which forms the center tunnel 37, and the metallic wiring protective cover 35, which is disposed to cover the DC line cable 23 and the control line cable 25, it is possible to form the cooling passage without providing the new dedicated member for protecting the duct.

The invention is not limited to the above-described embodiment but can appropriately be modified, improved, or the like. The hybrid electric vehicle has been described as a vehicle to which the invention is applied; however, the invention is not limited thereto, and the vehicle to which the invention is applied may be an electric vehicle that only includes a motor as a drive source, for example.

A vertical wall that extends toward the floor panel 36 and also extends in the vehicle longitudinal direction may be provided in the metallic wiring protective cover 35 so as to locate the DC line cable 23 or the control line cable 25 in the cooling passage 30, and the electromagnetic noise, which is generated from the DC line cable 23, may be prevented from influencing the control line cable 25.

In the above-described embodiment, the electric power converter 22 and the wiring protective cover 35 are disposed on the center tunnel 37 that is formed by the floor panel 36; however, the electric power converter 22 may be disposed under the passenger seat, and the wiring protective cover 35 may be disposed under the rear seat 4 at the rear of the passenger seat, for example. Also in this case, the DC line cable 23 can be formed as short as possible, and the influence of the noise can be reduced.

Figure 5:
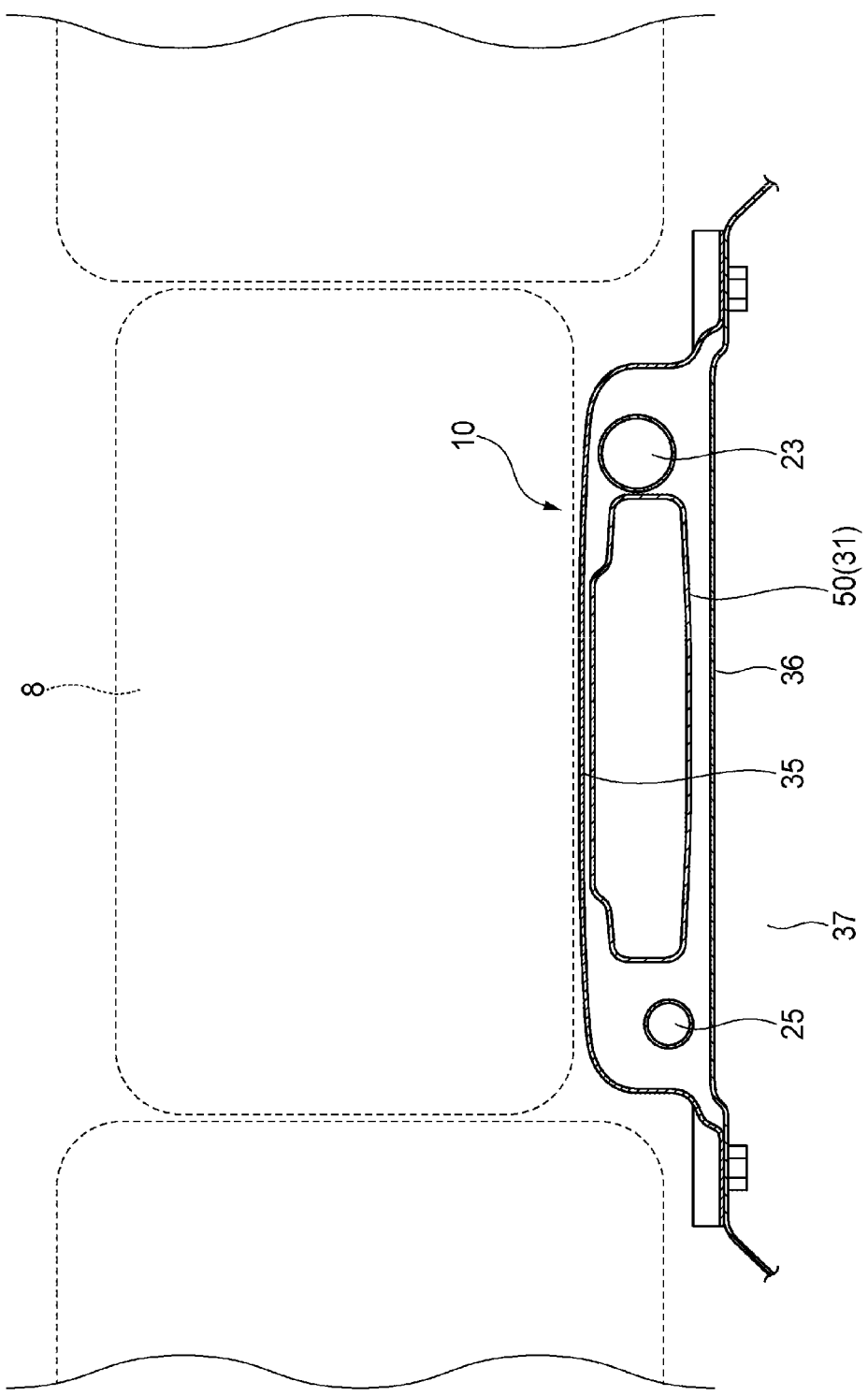
FIG. 5 is a cross-sectional view that corresponds to FIG. 4 and shows a modified example of the wiring protective cover structure for the electric drive vehicle of the invention.

In the above-described embodiment, the cooling passage 30 is directly formed by the metallic wiring protective cover 35 and the floor panel 36 that has the center tunnel 37. However, as shown in a modified example of FIG. 5, the cooling passage 30 may adopt a configuration including a duct member 50 that is made of a resin or the like and is additionally disposed in a space created by the metallic wiring protective cover 35 and the floor panel 36, which forms the center tunnel 37. Accordingly, the cooling passage 30 can be formed by the simple duct member 50 while the wiring protective cover 35 receives an external force.

Figure 6:
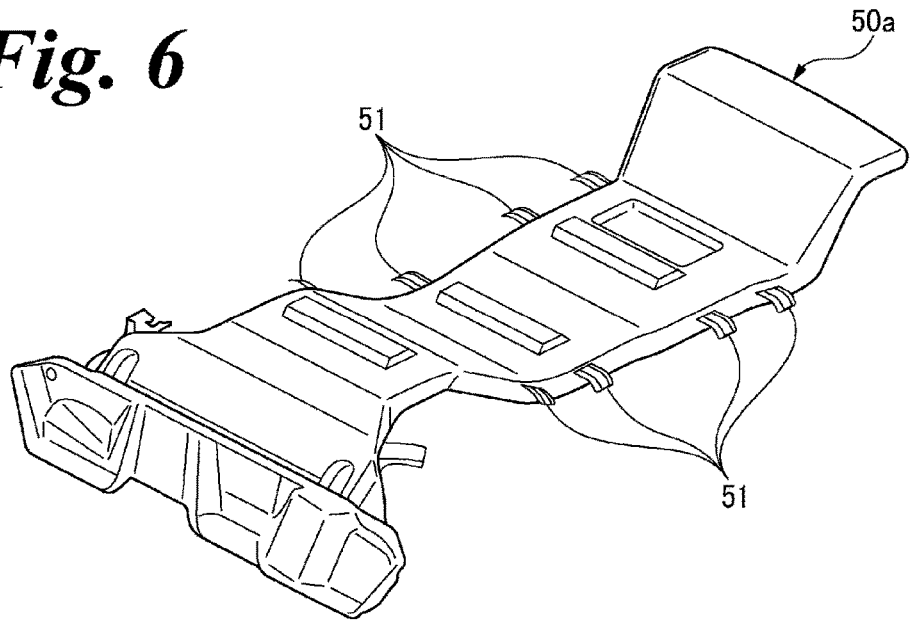
FIG. 6 is a perspective view of a duct member for showing another modified example of the wiring protective cover structure for the electric drive vehicle of the invention.
Figure 7:
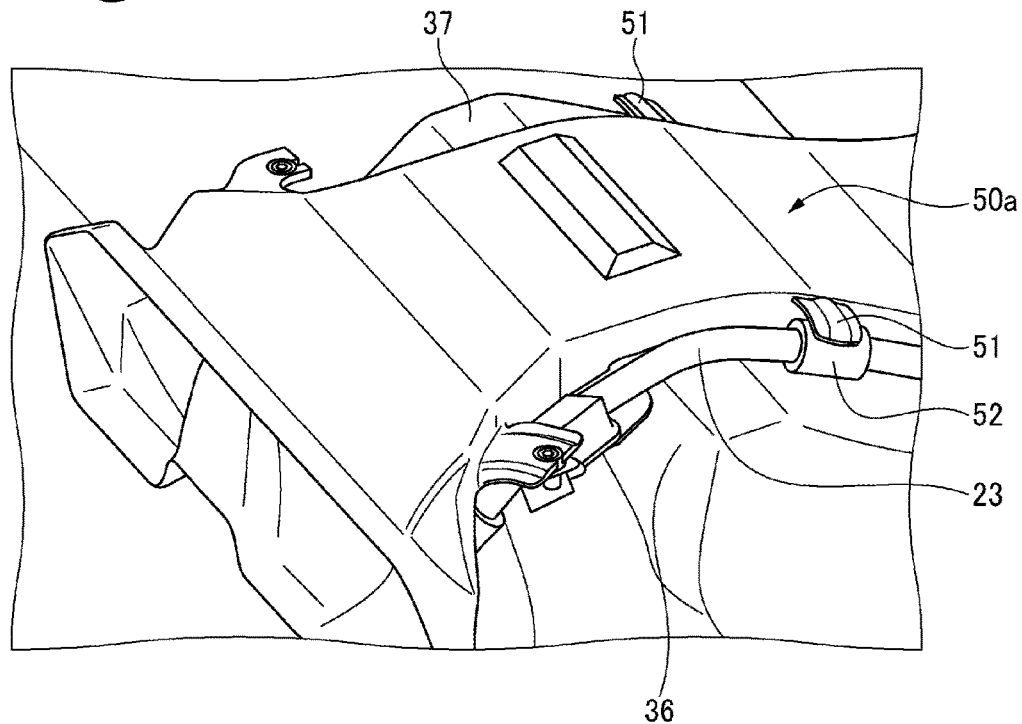
FIG. 7 is an enlarged perspective view of the main components in the rear part of the vehicle in a state that the rear seat and the wiring protective cover are removed for the illustration of the wiring protective cover structure in FIG. 6.
Figure 8:
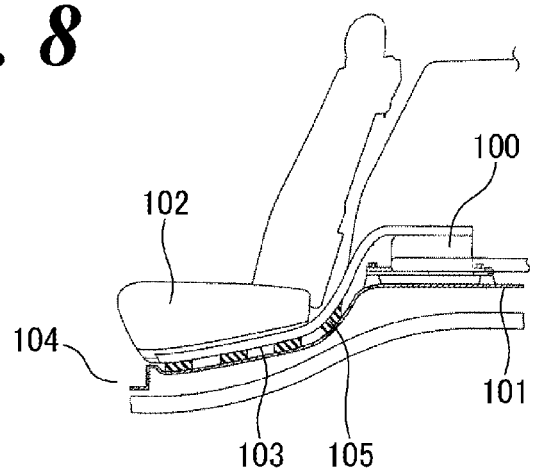
FIG. 8 is a cross-sectional view for showing conventional arrangement of an air supply pipe.
Figure 9:
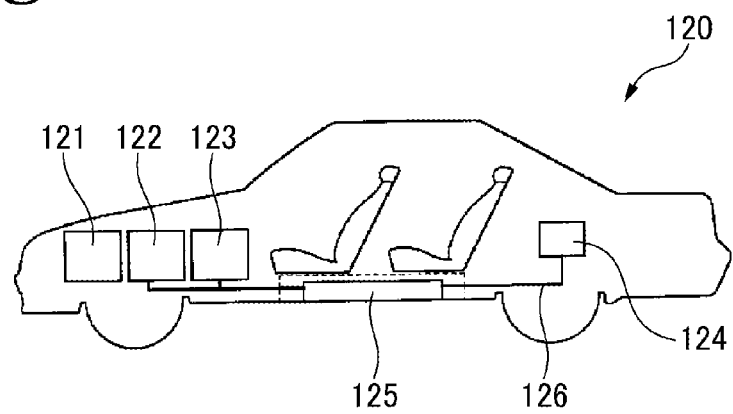
FIG. 9 is a cross-sectional view for showing another conventional arrangement of drive system members.

As shown in another modified example of FIG. 6, a duct member 50a is provided with plural wiring holding sections 51 (four pieces identified on each side in this embodiment) in a way such as each extending laterally from upper side surfaces on both sides in the vehicle width direction to be bent downward near the tip end portion. These wiring holding sections 51 restrain and hold the DC line cable 23 or the control line cable 25 by the downward force either directly or through ring-shaped fixtures 52 that are disposed around the cables 23, 25 as shown in FIG. 7.

The aforementioned duct member 50a eliminates the need of the harness fixing bracket conventionally used, such as fixing the cables 23, 25 to the floor panel 36, and further the number of positions to hold the cables 23, 25 can be reduced in comparison with a case where the harness fixing bracket is used. Therefore, it is possible to reduce assembling man-hours and cost for holding the cables 23, 25.

This patent application is based on Japanese Patent Application (No. 2011-233012) filed on Oct. 24, 2011, the contents of which are incorporated herein by reference.

DESCRIPTION OF REFERENCE NUMERALS AND SIGNS

4: rear seat (seat)
6: vehicle cabin
8: center seat cushion (seat)
21: battery
22: electric power converter
23: dc line cable (wiring)
25: control line cable (wiring)
30: cooling passage
31: intake duct
32: exhaust duct
35: metallic wiring protective cover
36: floor panel
37: center tunnel
39: floor carpet
40: opening
50, 50a: duct member

The invention claimed is:

1. A wiring protective cover structure for an electric drive vehicle
including:
a battery;
an electric power converter that converts electric power from the battery;
a cooling passage through which air used for cooling the battery flows;
wiring that connects the battery and the electric power converter; and
a wiring protective cover that protects the wiring,
wherein the battery and the electric power convertor are disposed via a rear seat in a front-rear direction of the electric drive vehicle,
wherein the cooling passage is disposed under the rear seat,
wherein the electric power convertor and the wiring protective cover are disposed on a center tunnel that is formed by a floor panel,
wherein the wiring is disposed on a top surface of the floor panel of the electric drive vehicle, and
wherein the wiring protective cover is formed as a metallic cover and that is disposed on the floor panel to define the cooling passage and to cover the wiring.

2. The structure of claim 1,
wherein the wiring includes a DC line cable that supplies electric power to the electric power converter and a control line cable that controls the battery, and
wherein the DC line cable and the control line cable are separately disposed at both sides of the wiring protective cover in a width direction of the electric drive vehicle.

3. The structure of claim 1,
wherein the cooling passage is directly formed by a portion of the floor panel forming the center tunnel and a portion of the metallic wiring protective cover covering the wiring.

4. The structure of claim 1,
wherein the cooling passage has a duct member disposed in a space formed by a portion of the floor panel forming the center tunnel and a portion of the metallic wiring protective cover covering the wiring.

5. The structure of claim 4,
wherein the duct member has plural wiring holding sections, each of which extends laterally from a side surface thereof in the vehicle width direction so as to hold the wiring.

6. The structure of claim 1,
wherein the wiring protective cover covers the floor panel across a front surface of the floor panel below a center seat cushion of the rear seat, and
wherein the front surface of the floor panel below the center seat cushion of the rear seat has an opening as an intake side of the cooling passage.

7. The structure of claim 1,
wherein the wiring protective cover is disposed to define a space having a cross-sectional shape elongated in a width direction of the electric drive vehicle.

\* \* \* \* \*